United States Patent
Gustavsson

(10) Patent No.: US 9,258,635 B2
(45) Date of Patent: *Feb. 9, 2016

(54) CONTROL CORD FOR HEADSETS AND AUXILIARY DEVICES

(71) Applicant: Research In Motion Limited, Ottawa (CA)

(72) Inventor: Bengt Stefan Gustavsson, Waterloo (CA)

(73) Assignee: BlackBerry Limited, Waterloo (CA)

( * ) Notice: Subject to any disclaimer, the term of this patent is extended or adjusted under 35 U.S.C. 154(b) by 561 days.

This patent is subject to a terminal disclaimer.

(21) Appl. No.: 13/667,849

(22) Filed: Nov. 2, 2012

(65) Prior Publication Data
US 2013/0064384 A1   Mar. 14, 2013

Related U.S. Application Data

(63) Continuation of application No. 12/825,632, filed on Jun. 29, 2010, now Pat. No. 8,320,579.

(51) Int. Cl.
*H04R 1/10*   (2006.01)
*H02B 1/00*   (2006.01)
(Continued)

(52) U.S. Cl.
CPC ............... *H04R 1/1041* (2013.01); *H04R 5/00* (2013.01); *H01L 41/113* (2013.01); *H04R 2420/09* (2013.01)

(58) Field of Classification Search
CPC ............... H04R 5/1033; H04R 1/1033; H04R 2460/03; H04R 1/10; H04R 1/1041; H04R 5/00; H04R 2420/09; H01L 41/08; H01L 41/113
USPC ............ 381/74, 334, 123, 384, 394, 190, 124
See application file for complete search history.

(56) References Cited

U.S. PATENT DOCUMENTS 4,568,851 A   2/1986 Soni
4,975,616 A   12/1990 Park
(Continued)

FOREIGN PATENT DOCUMENTS

EP      2164277     3/2010
WO   2001020573    3/2001

OTHER PUBLICATIONS

European Patent Application No. 13153762.3, Office Action dated Aug. 6, 2013.
(Continued)

*Primary Examiner* — Vivian Chin
*Assistant Examiner* — Douglas Suthers
(74) *Attorney, Agent, or Firm* — Borden Ladner Gervais LLP

(57) ABSTRACT

A cord-based controller for an auxiliary device, such as a headset, is provided for use with a portable electronic device. A pressure-sensitive, and preferably bendable, material such as a piezoelectric pressure sensor is placed within or on an or cord of a headphone lead, such as by wrapping it within the outer shielding of the cord. A self-powered controlling sensor is arranged to control the electronic device using a generated control signal. The controlling sensor comprises a sensor material. The control signal is generated by deformation of the sensor material independent of power supplied to the headset and independent of power supplied to the portable electronic device. This is achieved without requiring a separate housing for the controller, which typically protrudes from the cord. A plurality of control sensor elements can be provided, each producing a different control signal voltage transmitted along a single control signal electrical.

15 Claims, 6 Drawing Sheets

(51) Int. Cl.
*H04R 1/02* (2006.01)
*H04R 9/06* (2006.01)
*H04R 5/00* (2006.01)
*H01L 41/113* (2006.01)

(56) References Cited

U.S. PATENT DOCUMENTS

| | | | |
|---|---|---|---|
| 5,001,774 | A | 3/1991 | Lee |
| 7,256,347 | B2 | 8/2007 | Gustavsson |
| 7,534,957 | B2 | 5/2009 | Yamaura |
| 2007/0237170 | A1* | 10/2007 | Proctor et al. ............ 370/462 |

OTHER PUBLICATIONS

"P-876 DuraAct: Piezoelectric Patch Transducers", http://www.physikinstrumente.com/em/products/prdetail.php?sortnr=101790, published at least as early as Jan. 7, 2010.

European Patent Application No. 10167758.1, Search Report dated Dec. 10, 2010.

Buil et al., "Headphones with Touch Control", Proceedings of the 7th international conference on human computer interactions with mobile devices & services, Salzburg: ACM International Conference Proceedings Series, vol. 111, Sep. 19-22, 2005, pp. 377-378.

* cited by examiner

CONTROL CORD FOR HEADSETS AND AUXILIARY DEVICES

CROSS REFERENCE TO RELATED APPLICATIONS

This application is a continuation of U.S. patent application Ser. No. 12/825,632, filed Jun. 29, 2010, which is incorporated herein by reference in its entirety.

FIELD

The present disclosure relates generally to portable electronic devices. More particularly, the present disclosure relates to a control cord for an auxiliary device, such as a headset, for use with a portable electronic device.

BACKGROUND

Portable electronic devices, such as mobile devices or media players, provide a user with portable entertainment and/or mobile productivity functionality. Auxiliary devices or accessories, such as headsets or headphones, are commonly used in conjunction with the portable electronic device. Other auxiliary devices include Bluetooth™ devices, external keyboards, headsets with an integrated microphone, and other hands-free accessories.

For example, a headset permits a user to listen to audio originating from the portable electronic device by delivering the audio in-ear. The user can thus enjoy music or other audio content, such as a telephone conversation, even in a noisy or crowded environment, such as a bus, train, airport, or other public area. The headset connects to the portable electronic device via an electric cable or cord.

The term "headset" as used herein represents any headset, headphone, ear bud, or other device or apparatus capable of providing audio signals to a user. A headset designed for use with a mobile device can include a microphone permitting the user to fully participate in a telephone conversation.

While control of the portable electronic device is provided by controls on the device itself, it can be desirable to provide one or more controls remote from the device. Such remote control can be integrated as part of the auxiliary device, or as part of the cable or cord connecting the auxiliary device to the portable electronic device.

FIG. 1 illustrates a known headset with a remote device control housing on a cord connecting an earpiece to the portable electronic device. A headset 100 typically includes: an earpiece 102, which typically includes either a single earpiece element, or a pair of earpiece elements, one for each ear; and a cord 104 connecting the earpiece to the portable electronic device 106. A remote device control housing 108 is attached to the wire, and controls are mounted on, or in, the housing. The housing 108 is typically implemented as a big plastic box on the wire including the electronics and the buttons for remote control of the device. Such a housing can be very bulky. Especially for headphones without a microphone, the control box is mainly used to house the various control buttons.

BRIEF DESCRIPTION OF THE DRAWINGS

Embodiments of the present disclosure will now be described, by way of example only, with reference to the attached Figures.

DETAILED DESCRIPTION

Figure 1:
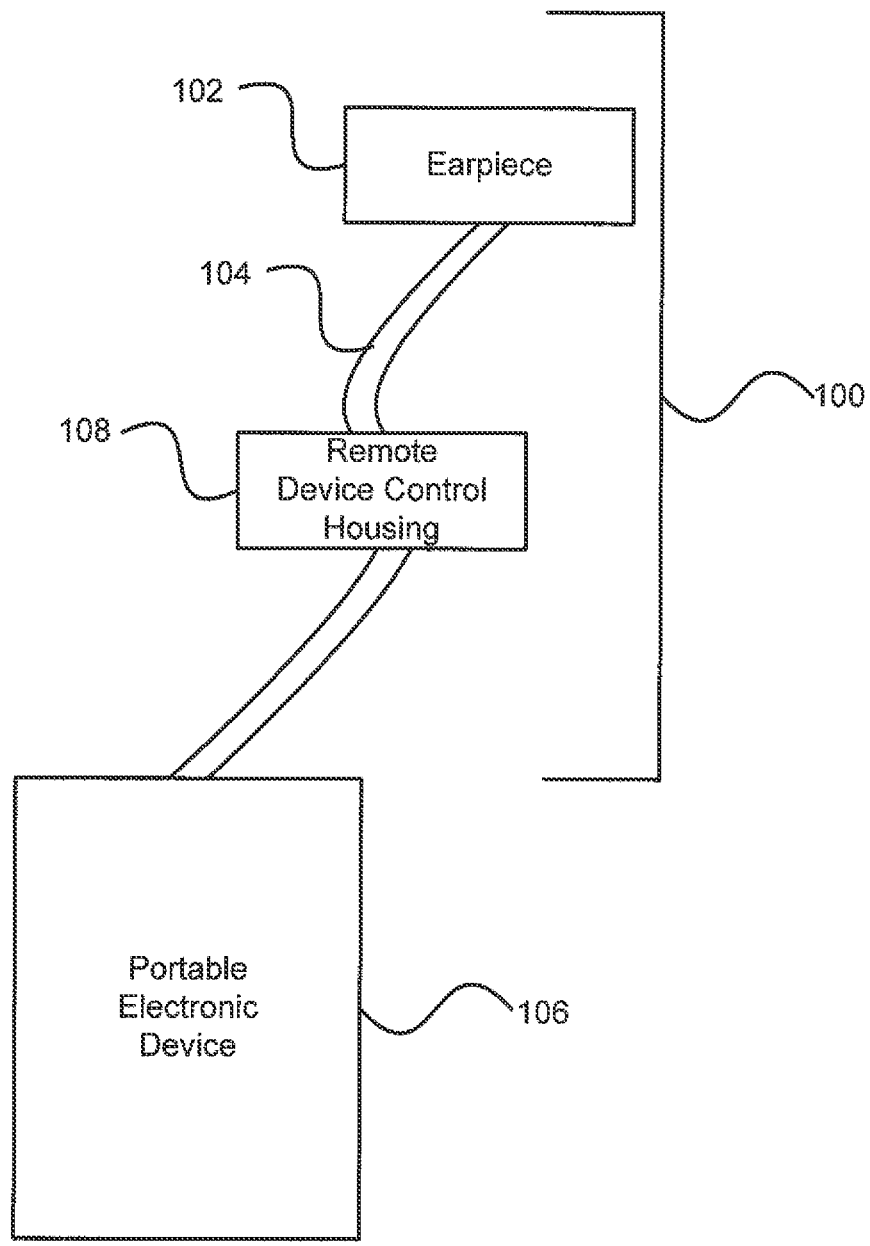
FIG. 1 illustrates a known headset with a remote device control on a cord connecting the earpiece(s) to the portable electronic device.

Generally, the present disclosure provides a cord-based controller for an auxiliary device, such as a headset, used with a portable electronic device. A pressure-sensitive, and preferably bendable, material such as a piezoelectric pressure sensor is placed within or on an audio cable or cord of a headphone lead, such as by wrapping it within the outer shielding, or insulation sheath, of the cord. A self-powered controlling sensor is arranged to control the electronic device using a generated control signal. The controlling sensor comprises a sensor material. The control signal is generated by deformation of the sensor material independent of power supplied to the headset and independent of power supplied to the portable electronic device. This is achieved without requiring a separate housing for the controller, which typically protrudes from the cord. A plurality of control sensor elements can be provided, each producing a different control signal voltage transmitted along a single control signal electrical connector.

It is an object of the present disclosure to obviate or mitigate at least one disadvantage of previous control cords for an auxiliary device used with a portable electronic device.

In an embodiment, the present disclosure provides a control cord for connecting a headset to a portable electronic device, and arranged to remotely control the portable electronic device. The control cord includes: an earpiece connector provided at one end of the cord; a device connector attached to another end of the cord for connecting to a portable electronic device; and a self-powered controlling sensor provided within the cord and in electrical communication with the electronic device. The self-powered controlling sensor is arranged to control the electronic device using a generated control signal. The controlling sensor comprises a sensor material. The control signal is generated by deformation of the sensor material independent of power supplied to the headset and independent of power supplied to the portable electronic device.

The sensor material can comprise a piezoelectric material. The cord can include a controller region and a non-controller region. The controller region has a distinctive appearance characteristic compared to the non-controller region, and the self-powered controlling sensor is provided in the controller region.

The cord can include an outer cable shielding, and the self-powered controlling sensor can be in direct contact with the outer cable shielding. The control cord can include a sensor shielding in which the self-powered controlling sensor is provided. The sensor shielding can have direct contact with an exterior or interior surface of the outer cable shielding. The self-powered controlling sensor can be integrated within the outer cable shielding.

The control cord can further include a physical indicator on an outer surface of the cord, the physical indicator positioned to indicate a location of the controlling sensor. The self-powered controlling sensor can be configured to generate first and second control signals.

The self-powered controlling sensor can include first and second sensor elements, the first and second sensor elements being configured to generate first and second control signals, respectively. The control cord can further include a single control signal wire arranged to transport the first and second control signals. The self-powered controlling sensor can include a plurality of sensor elements, each of the plurality of sensor elements configured to generate a unique control signal.

The first sensor element can be composed of a first amount of piezoelectric material and the second sensor element can be composed of a second amount of piezoelectric material. The first sensor element can be composed of piezoelectric material having a first thickness, and the second sensor element can be composed of piezoelectric material having a second thickness different from the first thickness.

The first and second sensor elements can be composed of a substantially similar amount of piezoelectric material. In that case, the control cord can further include a pressure absorbing rib associated with the first sensor element and arranged to absorb pressure applied to the first sensor element. The pressure absorbing rib consequently generates a modified first control signal having a voltage that is different from a first control signal voltage generated by deformation of the sensor material of the first sensor element in the absence of the pressure absorbing rib. The control cord can further include a level detector arranged to distinguish between the first and second control signals based on a detected voltage level.

In another embodiment, the present disclosure provides a headset including: a control cord for connecting the headset to a portable electronic device, and arranged to remotely control the portable electronic device; an earpiece attached to one end of the cord and connected to the cord via an earpiece connector; a device connector attached to another end of the cord for connecting to a portable electronic device; and a self-powered controlling sensor provided within the cord and in electrical communication with the electronic device. The self-powered controlling sensor is arranged to control the electronic device using a generated control signal. The controlling sensor comprises a sensor material. The control signal is generated by deformation of the sensor material independent of power supplied to the headset and independent of power supplied to the portable electronic device.

In a further embodiment, the present disclosure provides an auxiliary device control cord for connecting an auxiliary device to a portable electronic device, and arranged to remotely control the portable electronic device. The control cord includes an outer shielding and a self-powered controlling sensor provided in direct contact with the outer shielding of the cord and in electrical communication with the electronic device. The self-powered controlling sensor is arranged to control the electronic device using a generated control signal. The controlling sensor comprises a sensor material. The control signal is can be generated by deformation of the sensor material independent of any externally supplied power. The control signal can be generated independent of power supplied to the headset and independent of power supplied to the portable electronic device.

Other aspects and features of the present disclosure will become apparent to those ordinarily skilled in the art upon review of the following description of specific embodiments in conjunction with the accompanying figures.

Figure 2:
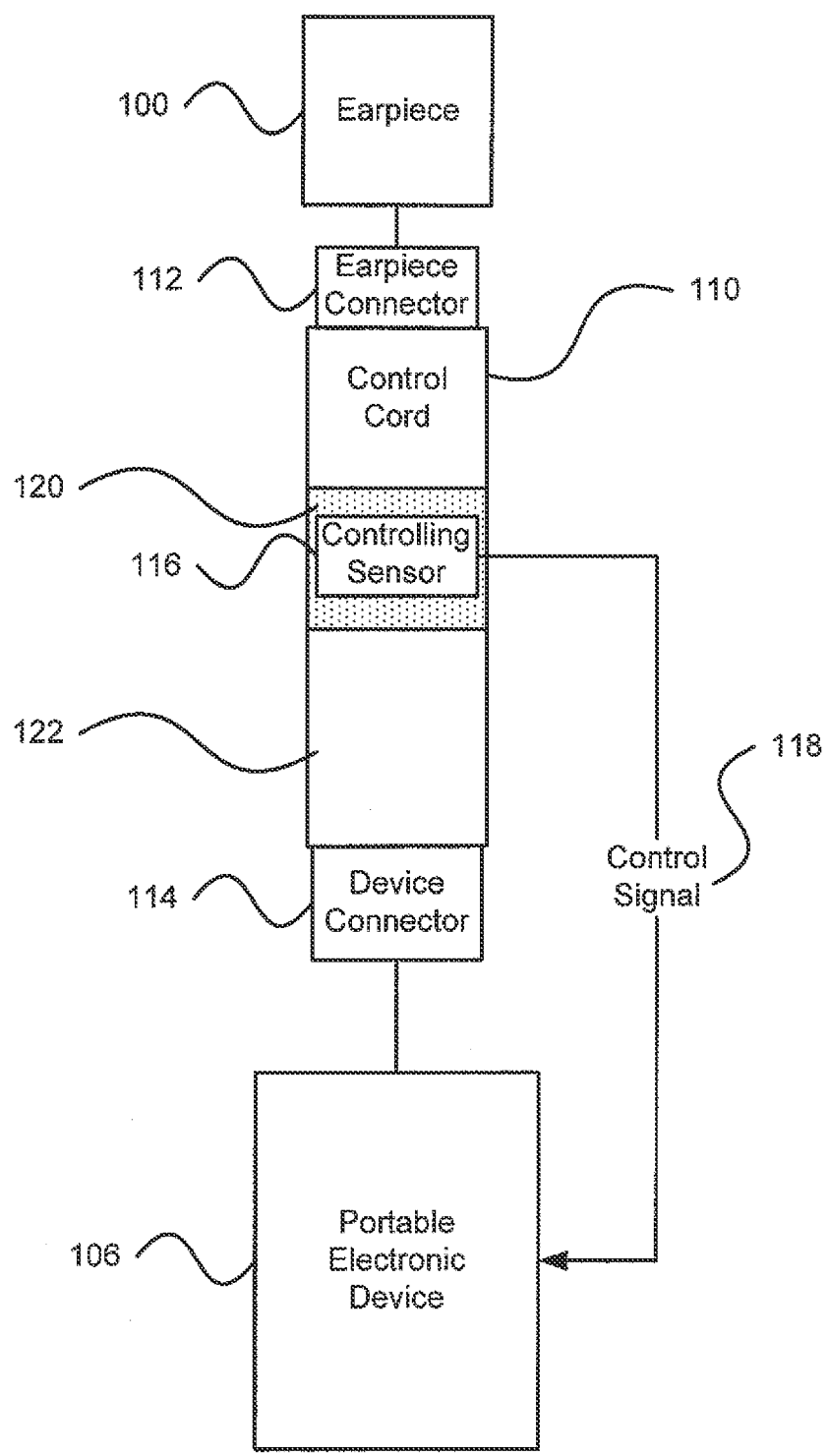
FIG. 2 illustrates a control cord for connecting an auxiliary device, such as a headset, to a portable electronic device according to an embodiment of the present disclosure.

FIG. 2 illustrates a control cord for connecting an auxiliary device, such as a headset, to a portable electronic device according to an embodiment of the present disclosure. A control cord 110 as shown in FIG. 2 is for connecting a headset, or other auxiliary device, to a portable electronic device 106, and arranged to remotely control the portable electronic device 106.

The control cord 110 includes an auxiliary device connector 112, shown in this example as an earpiece connector, provided at one end of the control cord 110.

The auxiliary device 102, shown in this example as an earpiece, is connected to the control cord 110 via the auxiliary device connector 112. A device connector 114 is attached to another end of the control cord 110 for connecting to the portable electronic device 106.

As described in relation to FIG. 1, some known approaches employ a housing provided in-line with a cord that houses controls, in a way that is bulky and typically has a significantly different form factor than the cord itself. The control cord 110 in FIG. 1 includes a self-powered controlling sensor 116 provided within the cord and in electrical communication with the electronic device 106.

The self-powered controlling sensor 116 is arranged to control the electronic device 106 using a generated control signal 118. Prior approaches required the use of externally supplied power to generate control signals to be sent to the device under control. In contrast, embodiments of the present disclosure employ a self-powered controlling sensor 116 that produces such control signals independent of any power supplied to the device or headset, such as by deformation of the material of which the controller is made.

One known approach described in U.S. Pat. No. 7,256,347 uses a number of conductors and resistors in the cord that are subjected to a short circuit depending on the area under pressure. In this previous approach, the device had to integrate small resistors in the sensor area to produce a desired voltage based on externally supplied current. In an embodiment of the present disclosure, the voltage generated is an output of the sensor itself.

Embodiments of the present disclosure provide a less complex and more realistic solution to the problem by eliminating the need for current to be externally supplied and subsequently short circuited. This approach reduces the number of components used, the number of conductors, or both, thereby permitting a less expensive implementation that can be employed in a number of instances in which no external power is supplied to, or required by, the auxiliary device. It also permits the control cord 110 of embodiments of the present disclosure to be differentiated by having a different shape with unique style.

By pressing on the portion of the cable containing the controlling sensor, or pressure sensor, 116 a user can control the portable electronic device 106 to perform certain functions. For example, if the portable electronic device 106 comprises an audio player, the controlling sensor can be used to change tracks, adjust volume, play or pause a current track.

The controlling sensor 116 comprises, or is composed of, a sensor material. The control signal 118 is generated by deformation of the sensor material, independent of power supplied to the auxiliary device and independent of power supplied to the portable electronic device. The controlling sensor 116 can comprise a voltage generating sensor, which is flexible, such as a piezoelectric sensor. A piezoelectric sensor converts pressure into an electrical signal. In an embodiment, the sensor material comprises a piezoelectric material. One example of a suitable material for the controlling sensor 116 is the P-876 DuraAct™ piezoelectric patch transducer from PI (Physik Instrumente) GmbH & Co. of Germany.

A piezoelectric device is more reliable, and less sensitive to bending compared to existing approaches. The piezoelectric sensor is a material that, when affected by a force, will change a voltage. The piezoelectric sensor generates a voltage instead of a current. A generated voltage is an easier way to transport a signal back to the detection circuit, and is easier to manufacture. In a known approach, a current was either on or off and a separate wire, or wire and resistor combination, was needed for each control function. While the previous approach can be adapted to have fewer wires, more resistors are then needed.

The control cord 110 can include a controller region 120 and a non-controller region 122. The controller region 120 has a distinctive appearance characteristic compared to the non-controller region 122. The self-powered controlling sensor 116 can be provided in the controller region 120. In an example, the controller region 120 can have a wider width than the non-controller region 112. In an embodiment, a wider area of the control cord can be provided with touch sensors, or piezoelectric sensors, beneath the wire shielding. In another example, the controller region 120 can have a different friction characteristic than the non-controller region 122. When the distinctive appearance characteristic is a distinctive physical characteristic, this enables a user to use the controls without having to look at them.

In another example, the controller region 120 includes one or more visual indicators to indicate the presence of the control sensor 116. Such a visual indicator can include: a printed label including an image or alphanumeric representation of a function of the control sensor; or the controller region having a different color than the non-controller region. For example, a sideways triangle with two vertical lines commonly associated a play/pause functionality can be printed in the controller region 120 above a control sensor 116, or control sensor element within the control sensor, that performs such functionality. In another example, small light emitting diodes (LEDs) can be placed in the wire to physically highlight certain areas. Such an indication can be beneficial for use in low-light conditions.

According to an embodiment of the present disclosure, the control cord 110 generates a voltage/current based on deformation of the piezoelectric material independent of an external power supply. The control cord 110 generates a control signal 118 independent of power supplied to the portable electronic device and/or power supplied to the auxiliary device or accessory which is associated with the cord.

An embodiment of the present disclosure provides a voltage generating sensor, which is easier to manufacture. The overall device is less costly and requires fewer parts. It is not necessary to bring any current to the sensor. In fact, in previous approaches, sending current to a sensor can introduce transients having noise-like behavior on a microphone line. A self-powered control sensor 116 of an embodiment the present disclosure converts mechanical work, or pressure, into electrical potential, as opposed to re-routing current, which is the known approach.

An advantage of embodiments of the present disclosure is the ability to use a control cable with a headset or other auxiliary device without any battery or microphone. There is no need to supply external power to the control cable, since the voltage is generated by the control sensor 116 itself, such as by way of a piezoelectric material.

In known devices, without a microphone, there is no existing current or power supply in the cord. So, you could not use this approach in the previous US patent unless you add another wire or provide two power sources. The microphone needs a bias current to operate, but the bias will disappear as long as a control key is pressed or activated. Providing a different voltage needs another wire.

A control cord 110 according to an embodiment of the present disclosure generates a control signal 118 indicating a desired control command without needing an external power supply, such that it is independent of any power supply. The detection of the control signal 118 is therefore less sensitive to variations in supply.

As described in relation to FIG. 2, the self-powered controlling sensor 116 is provided within the control cord 110 and in electrical communication with the electronic device 106.

Figure 3:
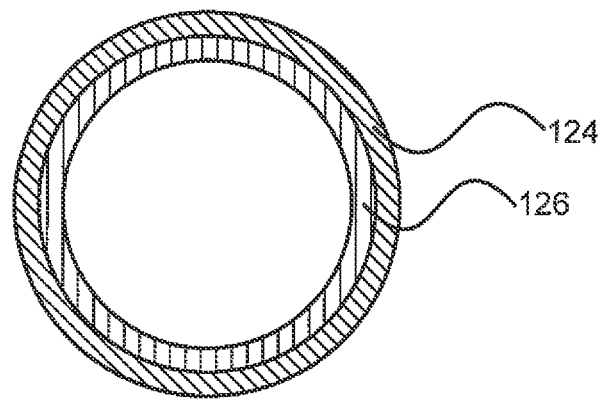
FIG. 3 illustrates an end cross-section view of a control cord including a self-powered controlling sensor according to an embodiment of the present disclosure.
Figure 4:
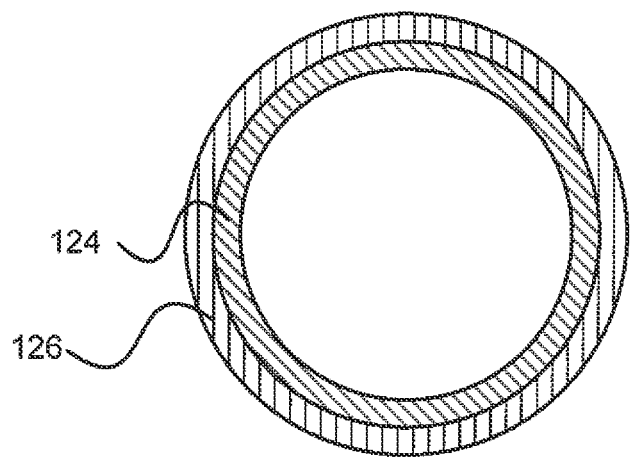
FIG. 4 illustrates an end cross-section view of a control cord including a self-powered controlling sensor according to another embodiment of the present disclosure.
Figure 5:
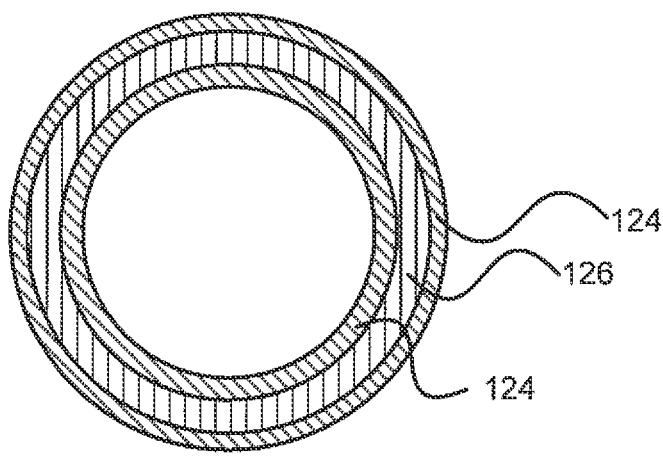
FIG. 5 illustrates an end cross-section view of a control cord including a self-powered controlling sensor according to a further embodiment of the present disclosure.

As shown in FIGS. 3 to 5, the control cord 110 can include an outer cable shielding 124. In an embodiment, the self-powered controlling sensor 116 has direct contact with the outer cable shielding 124. The control cord can further comprise a sensor shielding 126 in which the self-powered controlling sensor 116 is provided.

In the end cross-section view of FIG. 3, the sensor shielding 126 including the self-powered controlling sensor has direct contact with an interior surface of the outer cable shielding 124. In the end cross-section view of FIG. 4, the sensor shielding 126 has direct contact with an exterior surface of the outer cable shielding 124. In the end cross-section view of FIG. 5, the self-powered controlling sensor 116 is integrated within the outer cable shielding 124.

As described earlier, an exterior surface of the outer cable shielding 124 can comprise a physical indicator, the physical indicator positioned to indicate a location of the controlling sensor.

By having a piezoelectric material wrapped around, or within, the cord, the piezoelectric material will generate a voltage depending on the amount of pressure applied on it. The sensor shielding can be provided as a rubber hose with the piezoelectric material, and can be provided either directly beneath or above the existing cable shielding.

When a control cord 110 according to an embodiment of the present disclosure is used to remotely control a portable electronic device, it can be advantageous to generate more than one control signal 118 as shown in FIG. 1. In an embodiment, the self-powered controlling sensor 116 is configured to generate first and second control signals. In another embodiment, the self-powered controlling sensor 116 comprises a plurality of sensor elements, each of the plurality of sensor elements configured to generate a unique control signal.

Figure 6:
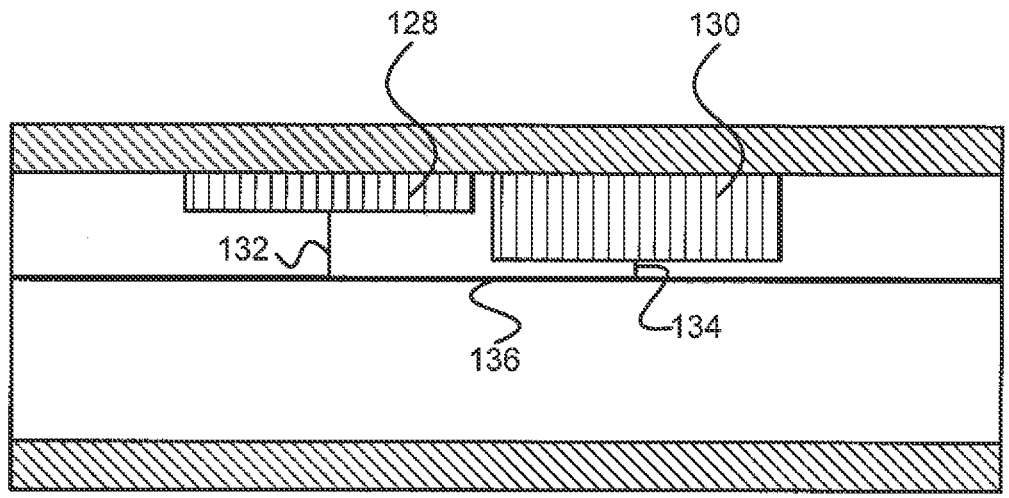
FIG. 6 illustrates a longitudinal cross-section view of a control cord including a self-powered controlling sensor having first and second control sensor elements according to an embodiment of the present disclosure.

FIG. 6 illustrates a longitudinal cross-section view of a control cord including a self-powered controlling sensor having first and second control sensor elements 128 and 130 according to an embodiment of the present disclosure. The first and second control sensor elements 128 and 130 are configured to generate first and second control signals 132 and 134, respectively. A single control signal wire 136, or control signal electrical conductor, is arranged to transport the first and second control signals 132 and 134. This is in contrast to known approaches in which a separate electrical conductor is used to transport each different control signal.

In an embodiment of the present disclosure, separate areas are defined with their own piezoelectric material. In this approach, the detection mechanism is simpler. There are two leads coming out of each piezoelectric material: one of which is shown connected to the single control signal electrical conductor 136; the other is not shown and is connected to common ground. The detection mechanism looks for a certain voltage at a certain spot.

Previously, it could be very complex because you end up with many wires going to one end of the cable. For example, to have two different control features or functionalities, two separate wires go to the end of the cable. Each wire is connected to ground, and a control function is initiated/detected by detecting a short between the voltage and ground on each of the wires. Adding a wire for each control is more expensive, less flexible, and makes a thicker control. The detection circuitry can be provided in a plug that connects the cord to the portable electronic device.

Embodiments of the present disclosure use a different amount of piezoelectric material to generate a different voltage, or control signal. For instance, if twice as much material is provided in sensor 1 than at sensor 2, sensor 1 will generate a voltage of 2× whereas sensor 2 generates a voltage of x. Rather than detecting a short on a plurality of wires, embodiments of the present disclosure detect a voltage and determine a control signal in response to a detected voltage level. In an embodiment, a large gap can be provided between steps of the voltage in order to more easily distinguish between generated control signals.

Figure 7:
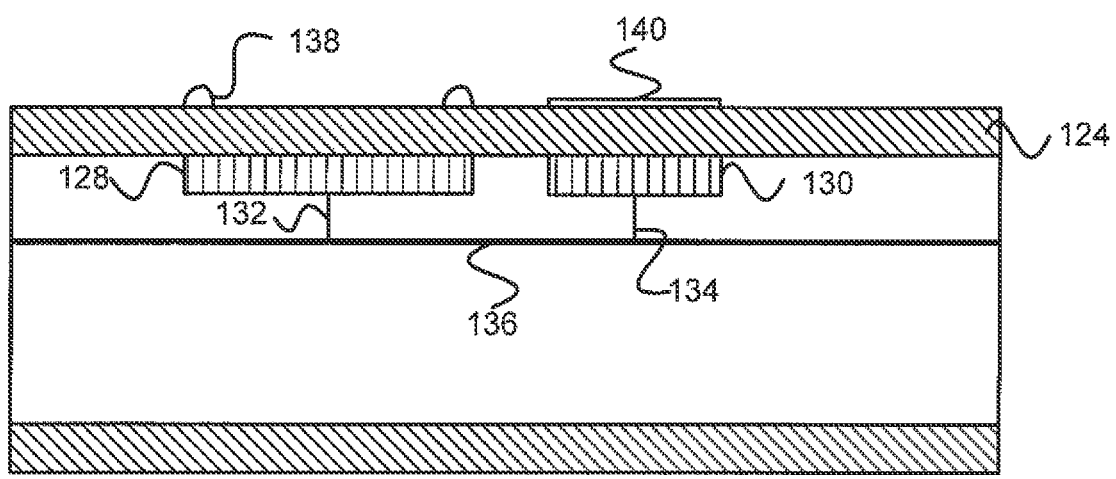
FIG. 7 illustrates a longitudinal cross-section view of a control cord including a self-powered controlling sensor having first and second control sensor elements according to another embodiment of the present disclosure.

In the embodiments of FIGS. 6 and 7, the first sensor element 128 is composed of a first amount of piezoelectric material and the second sensor element 130 is composed of a second amount of piezoelectric material. The controller can differentiate between "presses" in different regions of the piezoelectric sensor by using areas of different thickness, thereby allowing multiple "buttons" along the length of the sensor-bearing cord without the need to include additional sensor pads. To differentiate between presses in different areas, different thickness of the piezoelectric material can be used.

In the embodiment illustrated in FIG. 6, the first sensor element 128 is composed of piezoelectric material having a first thickness and the second sensor element 130 is composed of piezoelectric material having a second thickness different from the first thickness. In FIG. 7, the first and second sensor elements 128 and 130 have the same thickness, but different widths, accounting for the different amounts of piezoelectric material in each.

FIG. 7 also illustrates an example of a controller region having a distinctive appearance characteristic. In this example, one distinctive appearance characteristic comprises a visual indicator 138 arranged to indicate the presence of the first control sensor 128. In this example, the visual indicator 138 comprises a locator rib, or a pair of locator ribs provided near outer edges of a first controller region in which the first control sensor 128 is provided. The locator rib also functions as a distinctive physical characteristic, not just a distinctive visual characteristic. Small ribs can be used to change the tactile feel of a sensor area to guide a user to different functionality. A second visual indicator 140 indicates the presence of the second control sensor 130 in a second controller region.

While the second visual indicator 140 is shown in FIG. 7 to protrude from the exterior surface of the outer cable shielding 124, in another embodiment the second visual indicator 140 can be printed or incorporated directly onto the exterior surface of the outer cable shielding. This provides a distinctive appearance characteristic without having a protrusion.

Figure 8:
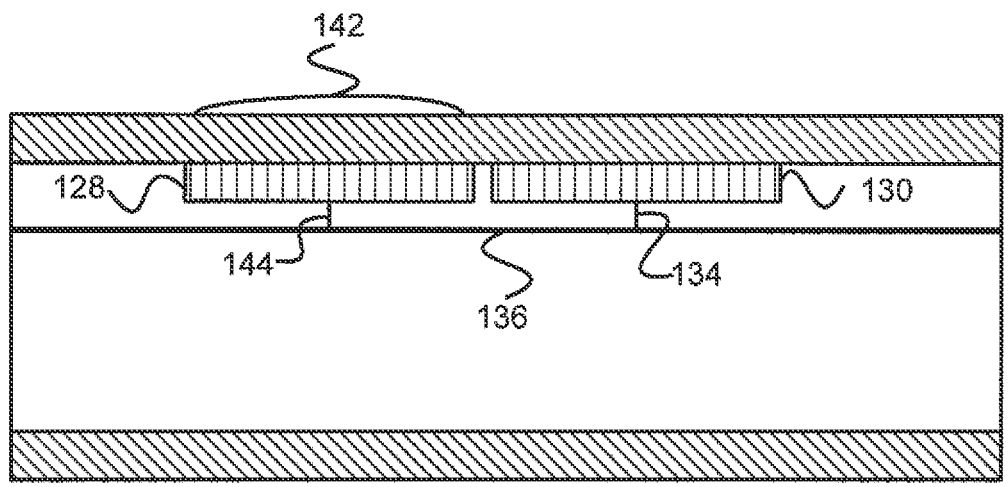
FIG. 8 illustrates a longitudinal cross-section view of a control cord including a self-powered controlling sensor having first and second control sensor elements according to a further embodiment of the present disclosure.

FIG. 8 illustrates a longitudinal cross-section view of a control cord including a self-powered controlling sensor having first and second control sensor elements according to a further embodiment of the present disclosure. This embodiment describes an approach to create different control signals from control sensor elements having substantially the same amount of piezoelectric material. This can be done, for example, by introducing plastic or rubber ribs to take some of the pressure off the piezoelectric material and by doing so changing the output voltage with the same amount of pressure.

In the embodiment of FIG. 8, the first and second sensor elements 128 and 130 are composed of a substantially similar amount of piezoelectric material. The control cord 110 of FIG. 8 further comprises a pressure absorbing rib 142 associated with the first sensor element 128 and arranged to absorb pressure applied to the first sensor element 128 and consequently generate a modified first control signal 144. The voltage of the modified first control signal 144 is different from a voltage of a first control signal 132 (shown in FIG. 6) generated by deformation of the sensor material of the first sensor element 128 in the absence of the pressure absorbing rib 142.

In embodiments of the present disclosure, a different number of sensor elements and corresponding control signals can be provided. In one embodiment, one button is provided, having play/pause, or hang up, functions, or the like. In another embodiment, three sensor elements can be provided, having exemplary functions such as: play/pause; skip forward; skip backward. In a further embodiment, five sensor elements and corresponding actuators or buttons can be provided with the same exemplary functions as the three-function example, plus volume up and volume down.

One way to implement this plurality of control actuators is to have five equivalent sensors, but then six wires are required: one with ground reference, and the five others connected to each of the sensors. Another approach is to design each sensor area to create a different voltage. So, in that case, only one wire is needed, or two wires along the cord, which is advantageous. A more sophisticated level detector may be employed at the other end.

Figure 9:
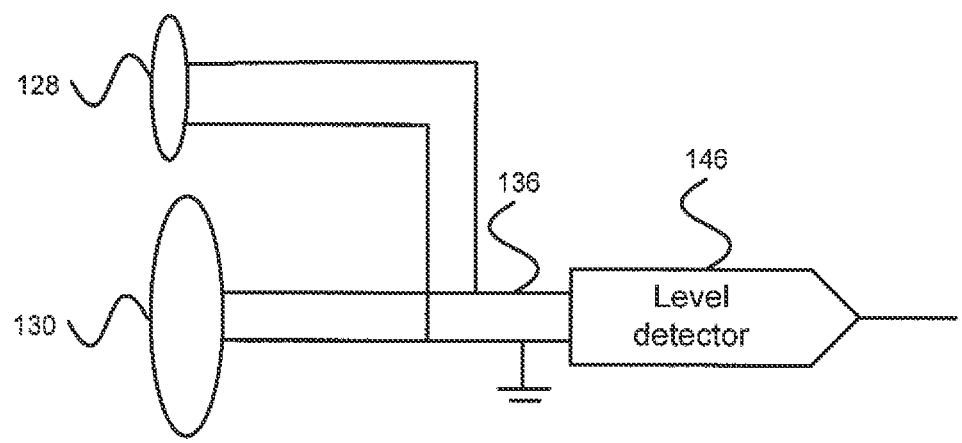
FIG. 9 illustrates an example of detection of actuation of a self-powered controlling sensor according to an embodiment of the present disclosure.

FIG. 9 illustrates an example of detection of actuation of a self-powered controlling sensor according to an embodiment of the present disclosure. A level detector 146 as shown in FIG. 9 can be implemented as an analog to digital converter (ADC). One output from each of the first and second sensor elements 128 and 130 is connected to ground. A control signal output from the first and second sensor elements 128 and 130, arranged to transport the first and second control signals 132 and 134 (shown in FIGS. 6 and 7), respectively, is connected to, or coupled to, a single control signal wire 136, as described earlier. The level detector 146 is arranged to distinguish between the first and second control signals 132 and 134 based on a detected voltage level. The points at which the sensor outputs are added on the control signal wire 136 are typically positioned close to the sensor itself, though other positioning such as in FIG. 9 can also be used.

In the example where the level detector 146, or detection circuit, is an ADC, the ADC can have an input impedance of about 50 to about 100 kOhms. An ADC provides a quantized and time sampled version of the input signal. The output of the ADC 146 can be in the range of about 10 mV to about 500 mV for realistic size piezo material. In an embodiment, the ADC 146 is sampling fast enough to catch the depression transient.

Since piezo material can be inefficient at maintaining the voltage under constant pressure, the depression and release of the material can be the trigger for the button press event. Therefore, in an embodiment, actuation of the self-powered controlling sensor can be defined as the depression and release of the sensor material. The level of the transient will then determine which key, or which sensor element, was pressed.

Figure 10:
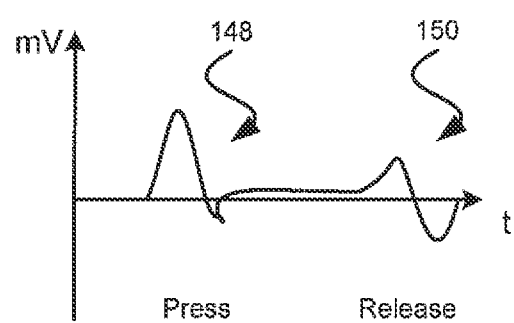
FIG. 10 is a graph illustrating transients caused by actuation of a sensor element that is part of a self-powered controlling sensor according to an embodiment of the present disclosure.

FIG. 10 is a graph illustrating examples of transients caused by actuation of a sensor element that is part of a self-powered controlling sensor according to an embodiment of the present disclosure. In an example, a first transient 148 is a result of pressing, or depression of, a sensor element, such as 128 or 130 shown in FIG. 9, and the second transient 150 is a result of releasing the sensor element. The transients produced in different implementations may have different shapes, amplitudes, or both, compared with those shown in FIG. 10.

As shown in FIG. 10, between the depression and release of a sensor element or self-powered controlling sensor, the voltage output can be non zero. Actuating a first sensor element can have an associated first voltage threshold, and actuating a second sensor element can have an associated second voltage threshold. Pressing and holding a sensor element can produce a pulse-like voltage output response.

Referring back to FIG. 9, the level detector 146 of FIG. 9 can be used to make determinations based on the detected voltage level. The level detector 146 can be arranged to distinguish between first and second control signals in response to a detected voltage level. For example, if the detected voltage level exceeds a first voltage threshold, then the level detector 146 can determine that the first sensor element has been actuated. If the detected voltage level exceeds a second voltage threshold, then the level detector 146 can determine that the second sensor element has been actuated.

If the detected voltage level is non-zero but does not exceed a stored voltage threshold, the level detector 146 can determine that a sensor element has been depressed but not released. This can be used to determine whether a subsequent depression detection should be disregarded, or should be treated differently. For example, the system can be designed such that maintaining depression of one sensor element while depressing another sensor element generates a different output signal, and corresponding function, than depressing either of the sensor elements individually. This can provide for an increased number of functions with the same number of sensor elements.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art without departing from the scope, which is defined solely by the claims appended hereto.

What is claimed is:

1. A control cord for connecting a headset to a portable electronic device, and arranged to remotely control the portable electronic device, the control cord comprising:
   an earpiece connector provided at one end of the control cord;
   a device connector attached to another end of the control cord for connecting to the portable electronic device;
   a self-powered controlling sensor provided within the control cord and in electrical communication with the portable electronic device, and arranged to control the portable electronic device using generated control signals, the controlling sensor comprising first and second sensor elements composed of a substantially similar amount of piezoelectric material, the first and second sensor elements configured to generate first and second control signals, respectively, the control signals being generated by deformation of the piezoelectric material independent of power supplied to the headset and independent of power supplied to the portable electronic device; and
   a pressure absorbing rib associated with the first sensor element and arranged to absorb pressure applied to the first sensor element, wherein different voltages are generated by the first and second control signals if an amount of pressure on the first and second sensor elements is the same.

2. The control cord of claim 1 wherein the control cord comprises a controller region and a non-controller region, the controller region having a distinctive appearance characteristic compared to the non-controller region, the self-powered controlling sensor being provided in the controller region.

3. The control cord of claim 1 wherein the control cord comprises an outer cable shielding, and wherein the self-powered controlling sensor is in direct contact with the outer cable shielding.

4. The control cord of claim 1 wherein the control cord comprises an outer cable shielding, and wherein the self-powered controlling sensor is integrated within the outer cable shielding.

5. The control cord of claim 1 wherein the control cord further comprises a physical indicator on an outer surface of the control cord, the physical indicator positioned to indicate a location of the self-powered controlling sensor.

6. The control cord of claim 1 wherein the self-powered controlling sensor is configured to generate first and second control signals.

7. The control cord of claim 1 further comprising a single control signal wire arranged to transport the first and second control signals.

8. The control cord of claim 1 wherein the first sensor element is composed of a first amount of piezoelectric material and the second sensor element is composed of a second amount of piezoelectric material.

9. The control cord of claim 1 wherein the first sensor element is composed of piezoelectric material having a first thickness and the second sensor element is composed of piezoelectric material having a second thickness different from the first thickness.

10. The control cord of claim 1 further comprising a level detector arranged to distinguish between the first and second control signals based on a detected voltage level.

11. The control cord of claim 1 wherein the self-powered controlling sensor comprises a plurality of sensor elements, each of the plurality of sensor elements configured to generate a unique control signal.

12. A headset comprising:
a control cord for connecting the headset to a portable electronic device, and arranged to remotely control the portable electronic device;
an earpiece attached to one end of the control cord and connected to the control cord via an earpiece connector;
a device connector attached to another end of the control cord for connecting to the portable electronic device; and
a self-powered controlling sensor provided within the control cord and in electrical communication with the portable electronic device, and arranged to control the portable electronic device using generated control signals, the controlling sensor comprising a piezoelectric material, the control signals being generated by deformation of the piezoelectric material independent of power supplied to the headset and independent of power supplied to the portable electronic device,
the self-powered controlling sensor comprising first and second sensor elements composed of a substantially similar amount of piezoelectric material, the first and second sensor elements configured to generate first and second control signals, respectively; and
a pressure absorbing rib associated with the first sensor element and arranged to absorb pressure applied to the first sensor element, wherein different voltages are generated by the first and second control signals if an amount of pressure on the first and second sensor elements is the same.

13. The headset of claim 12 wherein the control cord comprises an outer cable shielding, and wherein the self-powered controlling sensor is in direct contact with the outer cable shielding.

14. The headset of claim 12 further comprising a single control signal wire arranged to transport the first and second control signals.

15. The headset of claim 12 further comprising a level detector arranged to distinguish between the first and second control signals based on a detected voltage level.

* * * * *